US012610828B2

(12) United States Patent
Dong et al.

(10) Patent No.: US 12,610,828 B2
(45) Date of Patent: Apr. 21, 2026

(54) LEAD FRAME, PACKAGING STRUCTURE AND PACKAGING METHOD

(71) Applicant: Diodes Incorporated, Plano, TX (US)

(72) Inventors: MeiDan Dong, Shanghai (CN); Fang Tang, Shanghai (CN); Wenge Chen, Shanghai (CN)

(73) Assignee: Diodes Incorporated, Plano, TX (US)

( * ) Notice: Subject to any disclaimer, the term of this patent is extended or adjusted under 35 U.S.C. 154(b) by 407 days.

(21) Appl. No.: 18/220,980

(22) Filed: Jul. 12, 2023

(65) Prior Publication Data

US 2024/0234259 A1     Jul. 11, 2024

(30) Foreign Application Priority Data

Jan. 6, 2023    (CN) .......................... 202320046411.9

(51) Int. Cl.
*H10W 70/40*        (2026.01)
*H10W 72/00*        (2026.01)
(Continued)

(52) U.S. Cl.
CPC .... *H10W 70/417* (2026.01); *H10W 72/07336* (2026.01); *H10W 72/327* (2026.01);
(Continued)

(58) Field of Classification Search
CPC ......... H01L 24/30; H01L 24/05; H01L 24/83; H01L 24/29; H01L 23/49548; H01L 24/32; H01L 23/49582; H01L 23/49513; H01L 24/06; H01L 23/3135; H01L 23/49833; H01L 23/13; H01L 24/25;

H01L 23/3178; H01L 23/5385; H01L 24/73; H01L 23/49838; H01L 25/0655; H01L 21/6835; H01L 21/56; H01L 23/49822; H01L 23/562; H01L 21/568; H01L 23/5383; H01L 25/0657; H01L 21/563;
(Continued)

(56) References Cited

U.S. PATENT DOCUMENTS 6,204,454 B1 *   3/2001  Gotoh ................. H01L 23/5383
                                                        428/209
8,982,577 B1 *   3/2015  Fuentes ................... H01L 24/32
                                                        361/783
(Continued)

FOREIGN PATENT DOCUMENTS

CN        216413076 U      4/2022
CN        115000023 A      9/2022

*Primary Examiner* — Mouloucoulaye Inoussa
(74) *Attorney, Agent, or Firm* — AP3 Law Firm PLLC

(57)        ABSTRACT

A lead frame includes a base comprising a bearing surface for bearing a chip. The bearing surface includes a soldering region, with a solder layer arranged in the soldering region. The solder layer is configured for fixing the chip on the bearing surface. The lead frame includes a groove provided on the bearing surface in a thickness direction of the base. The groove is located outside the soldering region and surrounds at least part of the soldering region along the outer periphery of the soldering region for receiving solder paste overflowed from the soldering region. A depth of the groove is based on a thickness of the base. A packaging structure including the lead frame and a packaging method using the lead frame are also provided.

20 Claims, 8 Drawing Sheets

(51) Int. Cl.
   *H10W 72/30*        (2026.01)
   *H10W 72/90*        (2026.01)
   *H10W 90/00*        (2026.01)
(52) U.S. Cl.
   CPC ........ *H10W 72/332* (2026.01); *H10W 72/337*
      (2026.01); *H10W 72/926* (2026.01); *H10W*
      *72/932* (2026.01); *H10W 72/936* (2026.01);
                  *H10W 90/736* (2026.01)
(58) Field of Classification Search
   CPC ............. H01L 21/76224; H01L 21/561; H01L
      21/02304; H01L 23/3121; H01L 24/26;
      H01L 23/3185; H01L 21/4853; H01L
      21/4857; H01L 2224/29013; H01L
      2224/0603; H01L 2224/30051; H01L
      2224/32245; H01L 2224/3003; H01L
      2224/06051; H01L 2224/83815; H01L
      2224/05553; H01L 2924/1815; H01L
      2924/1811; H01L 2924/1434; H01L
      2221/68345; H01L 2224/73204; H01L
      2924/182; H01L 2225/06593; H01L
      2924/181; H01L 2225/06555; H01L
      2924/18161; H01L 2224/83385; H01L
      2924/10156; H01L 2224/16145; H01L
      2224/32145; H01L 2225/06513; H01L
      2924/00012; H01L 2924/15313; H01L
      2924/15311; H01L 2924/19041; H01L
      2924/3511; H01L 2924/14; H01L
      2224/32225; H01L 2224/26175
   See application file for complete search history.

(56)              References Cited

U.S. PATENT DOCUMENTS

| | | | | |
|---|---|---|---|---|
| 2002/0114577 A1* | 8/2002 | Kondo | ................. | G02B 6/4239 |
| | | | | 385/88 |
| 2004/0188831 A1* | 9/2004 | Hsiao | ...................... | H01L 23/10 |
| | | | | 257/E23.101 |
| 2005/0051885 A1* | 3/2005 | Weng | ................... | H10D 62/117 |
| | | | | 257/E29.022 |
| 2006/0046352 A1* | 3/2006 | Low | ...................... | H01L 21/563 |
| | | | | 257/E21.503 |
| 2007/0057373 A1* | 3/2007 | Okumura | ................ | H01L 24/32 |
| | | | | 257/746 |
| 2008/0315411 A1* | 12/2008 | Dahilig | ................... | H01L 23/13 |
| | | | | 257/737 |
| 2009/0072368 A1* | 3/2009 | Hu | ..................... | H01L 23/49844 |
| | | | | 257/676 |
| 2009/0085226 A1* | 4/2009 | Michalk | .................. | H01L 24/32 |
| | | | | 257/E23.169 |
| 2010/0025847 A1* | 2/2010 | Tomura | ................... | H01L 24/83 |
| | | | | 257/737 |
| 2010/0301464 A1* | 12/2010 | Arshad | ............ | H01L 23/49513 |
| | | | | 257/676 |
| 2011/0175217 A1* | 7/2011 | Jaunay | .............. | H01L 23/49548 |
| | | | | 257/692 |
| 2011/0260338 A1* | 10/2011 | Lee | ................... | H01L 23/49811 |
| | | | | 257/E21.511 |
| 2011/0286191 A1* | 11/2011 | Kim | ...................... | H01L 21/563 |
| | | | | 361/783 |
| 2013/0026655 A1* | 1/2013 | Lee | .......................... | H01L 24/83 |
| | | | | 257/E23.141 |
| 2013/0065361 A1* | 3/2013 | Shen | ................... | H01L 23/4952 |
| | | | | 257/E21.599 |
| 2013/0265645 A1* | 10/2013 | Izaki | .................... | G02B 7/1805 |
| | | | | 156/60 |
| 2013/0309816 A1* | 11/2013 | Xue | ........................ | H01L 24/40 |
| | | | | 438/123 |
| 2014/0175681 A1* | 6/2014 | Zhang | ..................... | H01L 23/31 |
| | | | | 257/787 |
| 2016/0225690 A1* | 8/2016 | Kadoguchi | ....... | H01L 23/49537 |
| 2016/0315067 A1* | 10/2016 | Chou | ..................... | H01L 24/97 |
| 2017/0162544 A1* | 6/2017 | Kwak | .............. | H01L 23/49827 |
| 2017/0179042 A1* | 6/2017 | Arvin | ............... | H01L 23/49822 |
| 2017/0256577 A1* | 9/2017 | Inoue | .................... | H10F 39/809 |
| 2017/0358558 A1* | 12/2017 | Lee | .................... | H01L 25/0657 |
| 2018/0277462 A1* | 9/2018 | Takahagi | ............ | H01L 23/3114 |
| 2019/0103361 A1* | 4/2019 | Raorane | ............ | H01L 23/3114 |
| 2019/0131271 A1* | 5/2019 | Kuo | ........................ | H01L 24/81 |
| 2019/0148283 A1* | 5/2019 | Arvin | ............... | H01L 23/49822 |
| | | | | 438/126 |
| 2019/0259633 A1* | 8/2019 | Maehara | ............... | H10F 39/804 |
| 2021/0104489 A1* | 4/2021 | Park | ........................ | H01L 24/32 |
| 2021/0143008 A1* | 5/2021 | Ko | ........................ | H01L 25/0657 |
| 2021/0159202 A1* | 5/2021 | Maehara | ................. | H01L 25/18 |
| 2022/0246504 A1* | 8/2022 | Seki | ................. | H01L 23/49562 |
| 2023/0066598 A1* | 3/2023 | Lai | ...................... | H01L 23/3135 |
| 2024/0055385 A1* | 2/2024 | Hsieh | ..................... | H01L 24/30 |
| 2024/0363576 A1* | 10/2024 | Chou | ..................... | H01L 24/26 |
| 2025/0069981 A1* | 2/2025 | Tokumaru | .............. | H01L 25/18 |

* cited by examiner

LEAD FRAME, PACKAGING STRUCTURE AND PACKAGING METHOD

CROSS-REFERENCE TO RELATED APPLICATIONS

This patent application claims priority to Chinese Application No. 202320046411.9, filed on Jan. 6, 2023 and entitled "Lead Frame, Packaging Structure and Packaging Method," which is hereby incorporated by reference herein as if reproduced in its entirety.

TECHNICAL FIELD

The present disclosure relates to the field of semiconductor device packaging, and in particular embodiments, to a lead frame, packaging structure and packaging method.

BACKGROUND

For chips that need to be flip-chip mounted on a lead frame, solder paste is brushed on the corresponding source region and gate region of the lead frame in order to complete the flip-chip soldering. However, because the solder paste is in a flowing liquid state in high temperature reflow, it will flow and accumulate along the lead frame, resulting in the phenomenon of solder overflow. When the solder paste accumulates to a certain height, it will be in contact with the side (drain) of the chip, so that the source and drain are connected, or the gate and drain are connected, causing short or leakage.

SUMMARY

Technical advantages are generally achieved, by embodiments of this disclosure which describe a lead frame, packaging structure and packaging method.

Embodiments of the present application provide a lead frame, a packaging structure and a packaging method, which solve the problem of short or leakage that may easily occur during the existing process of assembling a flip-chip mounted chip and a lead frame.

Embodiments of the present application provide a lead frame, including: a base, wherein the base has a bearing surface for bearing a chip, and a soldering region is provided on the bearing surface; a solder layer arranged in the soldering region for fixing the chip on the bearing surface; wherein the bearing surface is provided with a groove in a thickness direction of the base, and the groove is located outside the soldering region and surrounds at least part of the soldering region along the outer periphery of the soldering region for collecting solder paste overflowed from the soldering region.

Optionally, the groove is spaced apart from the soldering region.

Optionally, the groove is in contact with a boundary of the soldering region.

Optionally, the groove includes an opening and an inner bottom wall, and the opening and the inner bottom wall are arranged opposite to each other in the thickness direction; a distance between the opening and the inner bottom wall is H1, and a thickness of the base is H2, which satisfies: $H1=(\frac{1}{3}\sim\frac{1}{2})\times H2$.

Optionally, a width of the opening of the groove is H3, which satisfies: $H3=(\frac{1}{2}\sim1)\times H2$.

Optionally, the base includes a first base and a second base arranged at intervals; the soldering region includes a first soldering region disposed on the first base and a second soldering region disposed on the second base, the solder layer arranged in the first soldering region is used for soldering with a source of the chip, and the solder layer arranged in the second soldering region is used for soldering with a gate of the chip; the groove is provided on a bearing surface of the second base; and/or, the groove is provided on a bearing surface of the first base.

Optionally, the groove further includes two inner sidewalls oppositely arranged, and at least one inner sidewall of the two inner sidewalls that is adjacent to a boundary of the soldering region has a slope structure.

Optionally, a thickness of the solder layer is greater than or equal to 10 μm.

Optionally, the lead frame further includes pins, the pins are arranged on the outer peripheral wall of the base and protrude from thereof, the number of the pins is greater than 1, and the pins are arranged at intervals along the periphery of the base; and the pins include a first pin electronically connected to a source of the chip and a second pin electronically connected to a gate of the chip.

Meanwhile, embodiments of the present application also provide a packaging structure, including the aforementioned lead frame.

Meanwhile, embodiments of the present application also provide a packaging method that includes the following steps: providing the aforementioned lead frame; coating solder paste in the soldering region of the lead frame to form the solder layer; placing flip-chip the chip on the bearing surface of the base, with the source and the gate of the chip being respectively in contact with the solder layer, and performing a high temperature reflow soldering process to connect the chip to the lead frame by soldering; forming a plastic packaging layer on the bearing surface of the base to package the chip, wherein the pins of the lead frame are located outside the plastic packaging layer.

According to one aspect of the present application, a lead frame is provided that includes: a base, the base comprising a bearing surface for bearing a chip, and the bearing surface comprising a soldering region; a solder layer arranged in the soldering region, the solder layer configured for fixing the chip on the bearing surface; and a groove provided on the bearing surface in a thickness direction of the base, the groove being located outside the soldering region and surrounding at least part of the soldering region along the outer periphery of the soldering region for receiving solder paste overflowed from the soldering region, wherein a depth of the groove is based on a thickness of the base.

According to another aspect of the present application, a packaging structure is provided that includes a lead frame, and the lead frame comprises: a base, the base comprising a bearing surface for bearing a chip, and the bearing surface comprising a soldering region; a solder layer arranged in the soldering region, the solder layer configured for fixing the chip on the bearing surface; and a groove provided on the bearing surface in a thickness direction of the base, the groove being located outside the soldering region and surrounding at least part of the soldering region along the outer periphery of the soldering region for receiving solder paste overflowed from the soldering region, wherein a depth of the groove is based on a thickness of the base.

According to another aspect of the present application, a packaging method is provided that includes: providing a lead frame. The lead frame includes: a base, the base comprising a bearing surface for bearing a chip, and the bearing surface comprising a soldering region; and a groove provided on the bearing surface in a thickness direction of the base, the groove being located outside the soldering region and surrounding at least part of the soldering region along the outer periphery of the soldering region for receiving solder paste overflowed from the soldering region, wherein a depth of the groove is based on a thickness of the base. The packaging method further includes: forming a solder layer in the soldering region by coating solder paste in the soldering region; placing flip-chip the chip on the bearing surface of the base, with a source and a gate of the chip being in contact with the solder layer, and performing high temperature reflow soldering to connect the chip and the lead frame by soldering; and forming a plastic packaging layer on the bearing surface of the base to package the chip, wherein pins of the lead frame are located outside the plastic packaging layer.

The beneficial effect of the present application is to provide a lead frame, a packaging structure including the lead frame and a method for packaging a chip using the lead frame. A soldering region is provided on a bearing surface of the lead frame, a solder layer is provided in the soldering region for fixedly mounting the chip on the bearing surface, and a groove is provided on the bearing surface. The groove surrounds at least part of the soldering region along the outer periphery of the soldering region, such that when the chip is flip-chip mounted to the bearing surface of the lead frame through the solder layer, overflowed solder paste in the solder layer can flow to the groove and be stored in the groove. This prevents accumulation of the overflowed solder paste, which may cause the source and/or gate of the chip to be in contact with the drain of the chip, resulting in short or leakage. Thus, by draining the overflowed solder paste, the problem of the overflowed solder paste causing short or leakage is resolved, and the process of providing the groove is simple. Embodiments of the present application thus can effectively reduce the cost, and improve the stability and safety of using semiconductor devices.

BRIEF DESCRIPTION OF THE DRAWINGS

In order to more clearly illustrate technical solutions in embodiments of the present application, drawings in the embodiments of the present application are briefly described in the following. Obviously, the drawings in the following description are only some embodiments of the application, and those skilled in the art may also obtain other drawings based on these drawings without making creative efforts.

The technical solutions and beneficial effects of the present application will be made apparent through the detailed description of embodiments of the present application in conjunction with the accompanying drawings, in which.

Figure 1:
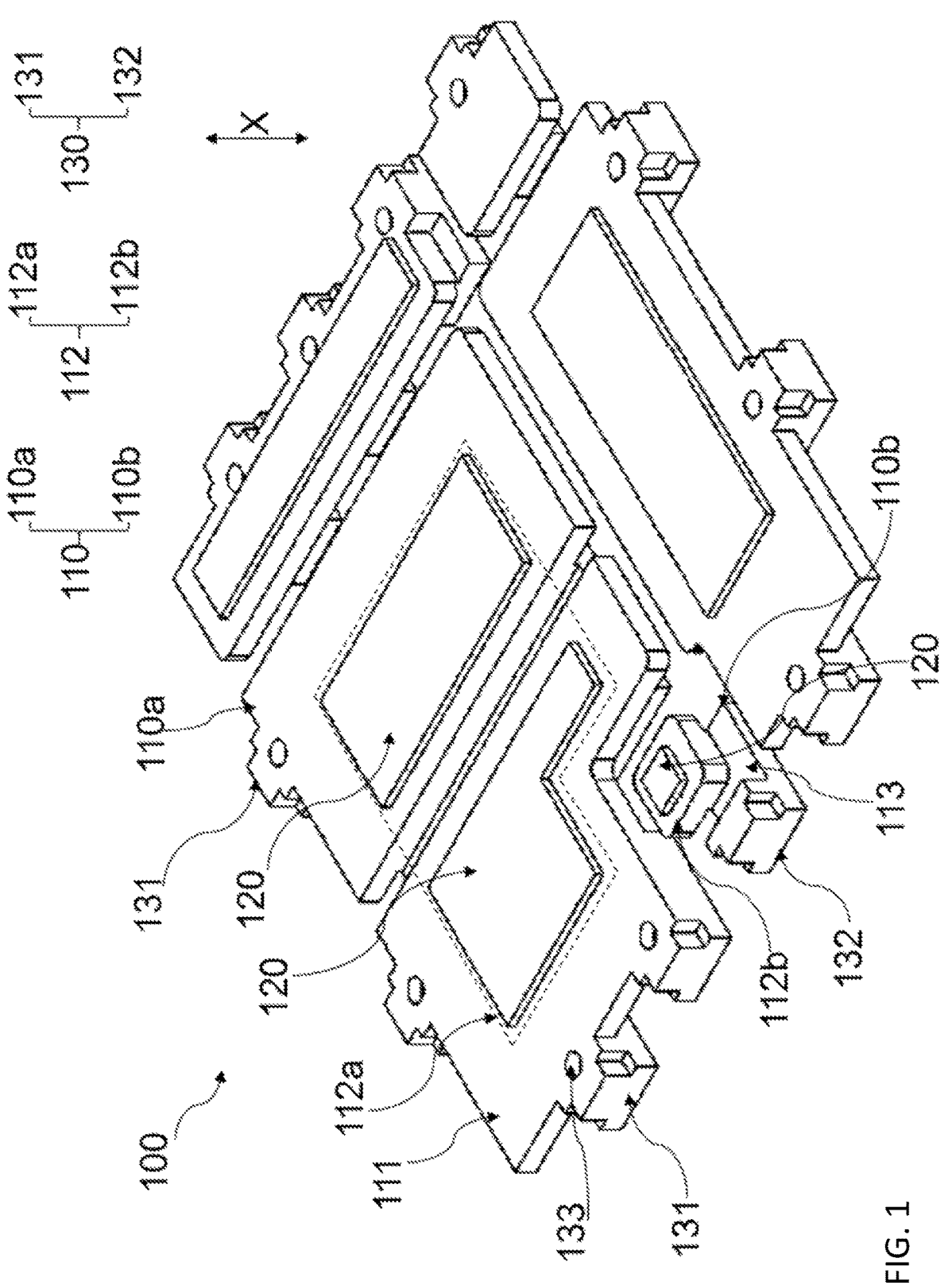
FIG. 1 is a schematic structural diagram of a lead frame according to an embodiment of the present application.

Explanation of reference signs in the drawings: 100, lead frame; 110, base; 110*a*, first base; 110*b*, second base; 111, bearing surface; 112, soldering region; 112*a*, first soldering region; 112*b*, second soldering region; 113, groove; 1131, opening; 1132, inner bottom wall; 1133, inner sidewall; 120, solder layer; 121, solder paste; 130, pin; 131, first pin; 132, second pin; 133, through hole; 200, chip; 210, source; 220, gate; X, thickness direction.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

The technical solutions of embodiments of the present application will be clearly and completely described below in conjunction with the accompanying drawings of the embodiments of the present application. Obviously, the described embodiments are only some, but not all, embodiments of the present application. Based on the embodiments of the present application, all other embodiments obtained by those skilled in the art without making creative efforts belong to the protection scope of the present application. In addition, it should be understood that the specific embodiments described herein are only used for illustration and explanation, and are not intended to limit the present application. In this application, unless stated to the contrary, orientation related terms used, such as "on" and "below", generally refer to being on and below a device that is in an actual use or operation state, and specifically, refer to the direction as shown in the drawings; and "inside" and "outside" are used with reference to the outline of the device. In addition, the terms "first" and "second" are used for descriptive purposes only, and should not be interpreted as indicating or implying relative importance or as implicitly specifying a quantity of indicated technical features. Thus, a feature limited with "first" or "second" may explicitly indicate or implicitly include one or more of the features.

Embodiments of the present application provide a lead frame, a package structure including the lead frame and a method for packaging a chip using the lead frame. According to some embodiments, a soldering region is provided on a bearing surface of the lead frame, a solder layer is provided in the soldering region for fixedly mounting the chip on the bearing surface, and a groove is provided on the bearing surface. The groove surrounds at least a part of the soldering region along the outer periphery of the soldering region, such that when the chip is flip-chip mounted to the bearing surface of the lead frame through the solder layer, overflowed solder paste in the solder layer can flow to the groove and be stored in the groove. This prevents accumulation of the overflowed solder paste, which may cause the source and/or gate of the chip to be in contact with the drain of the chip, resulting in short or leakage. Thus, through drainage of the overflowed solder paste, the problem of the overflowed solder paste causing short or leakage is resolved. Further, the process of providing the groove is simple. The embodiments thus can effectively reduce the cost, and improve the stability and safety of using semiconductor devices. As a typical application, the packaging structure including the lead frame can be used for packaging MOSFET chips.

In an embodiment of the present application, a lead frame 100 is provided. Referring to FIG. 1 to FIG. 5, the lead frame 100 includes: a base 110 and a solder layer 120.

Figure 2:
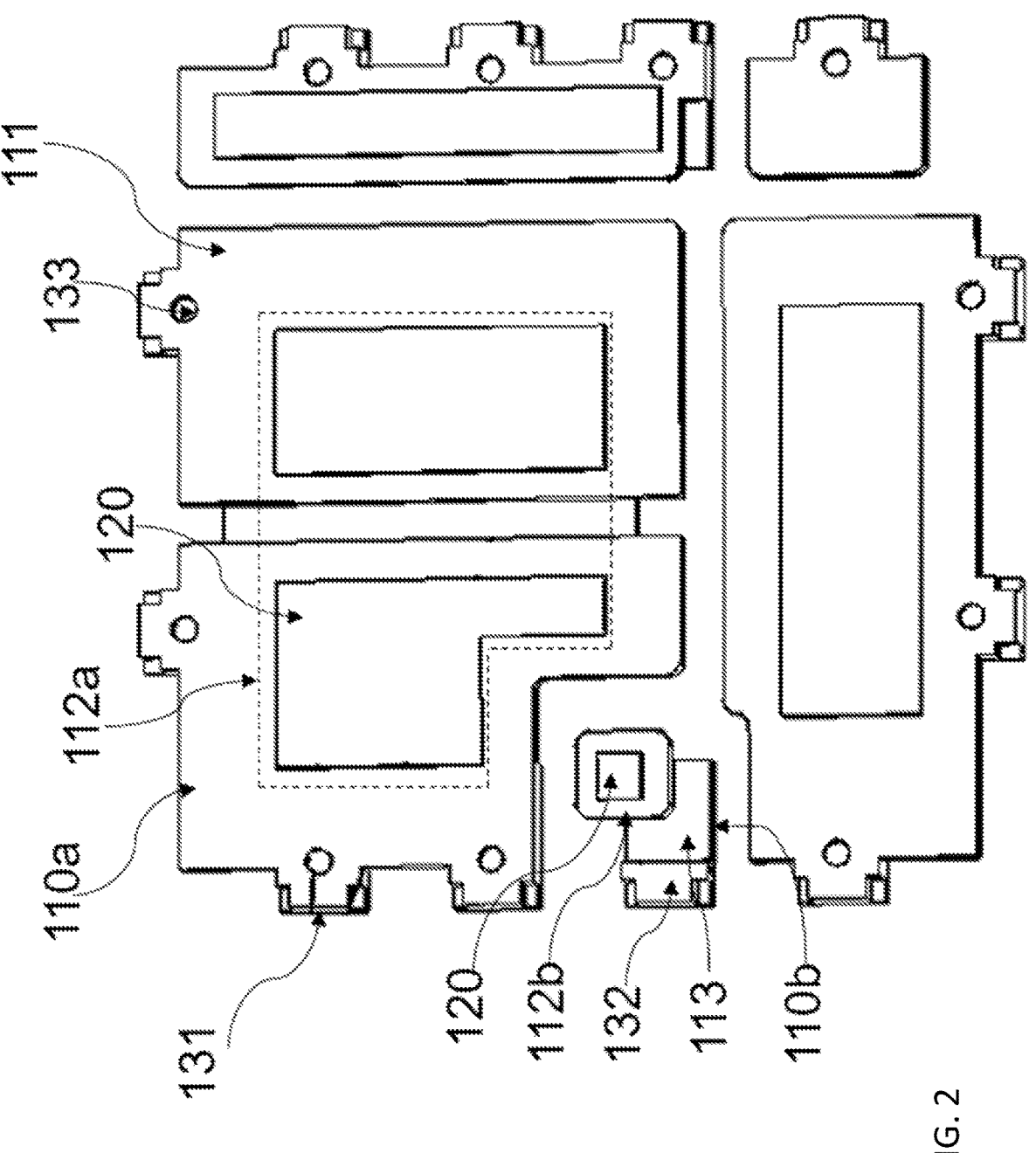
FIG. 2 is a top view of FIG. 1.
Figure 4:
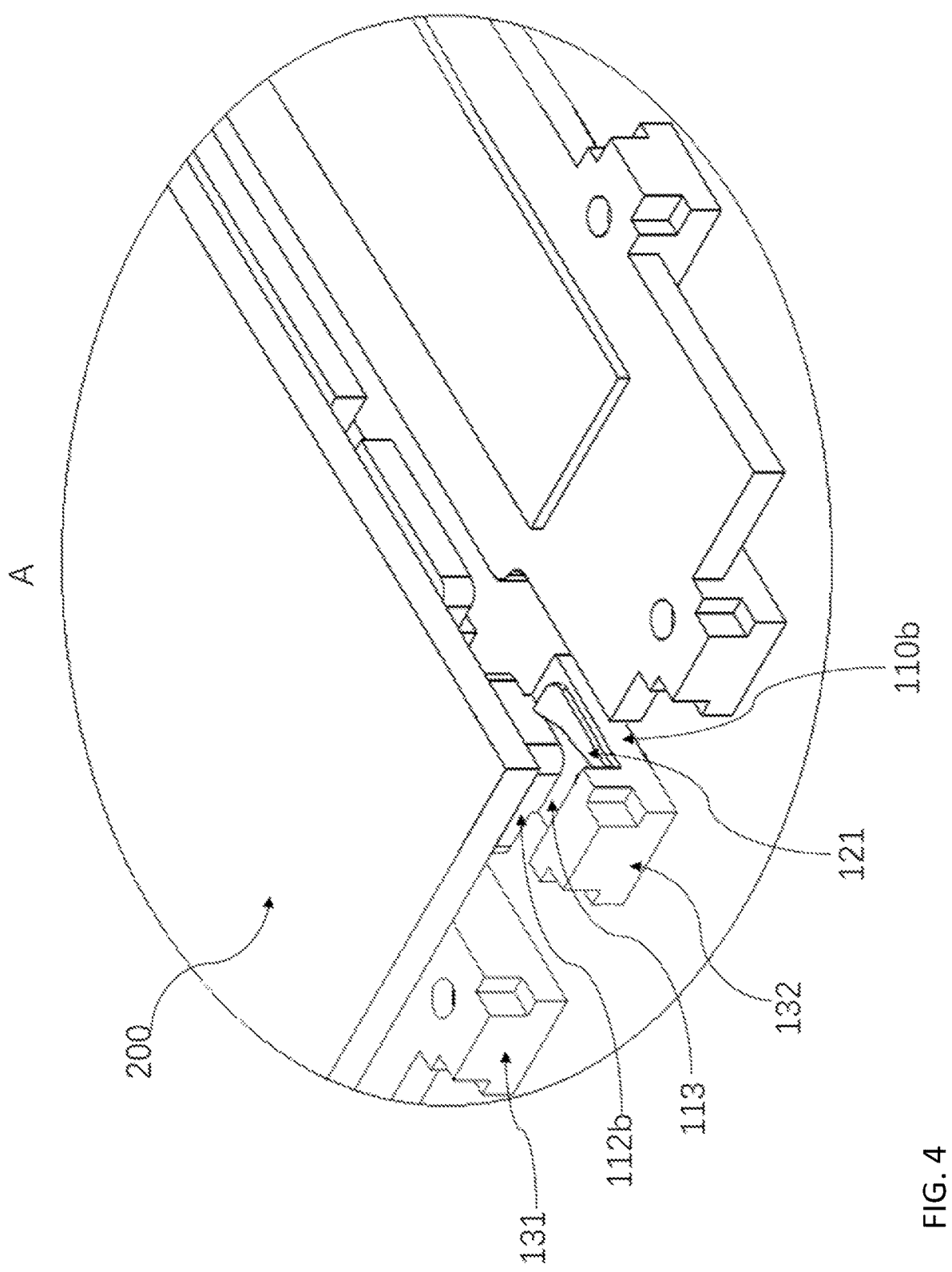
FIG. 4 is an enlarged schematic structural diagram of a portion A in FIG. 3.

Referring to FIG. 1, the base 110 has a bearing surface 111 for bearing a chip 200, and specifically, the base 110 has, in its thickness direction, a first surface and a second surface oppositely arranged, and the first surface is the bearing surface 111 of the base 110. Referring to FIG. 2, a soldering region 112 is provided on the bearing surface 111, and the solder layer 120 is provided in the soldering region 112 for fixing the chip 200 on the bearing surface 111. The bearing surface 111 is provided with a groove 113 in the thickness direction X of the base 110. The groove 113 is located outside the soldering region 112, and surrounds at least part of the soldering region 112 along the outer periphery of the soldering region 112. Referring to FIG. 4, the groove is provided to collect solder paste 121 overflowed from the soldering region 112.

The solder layer 120 is provided in the soldering region 112 by coating or printing the solder paste 121. In this embodiment, the solder paste 121 is tin paste. The chip 200 and the solder paste 121 in the solder layer 120 are soldered using a high-temperature reflow soldering process, to realize the fixed connection between the chip 200 and the base 110 of the lead frame 100. Since the solder paste is in a liquid state during the high-temperature reflow process and has fluidity, when the chip 200 is flip-chip mounted on the solder layer 120, and due to the weight of the chip 200 and the fluidity of the liquid solder paste, the solder paste will flow along the bearing surface 111 of the base 110 and overflow to the outside edge of the chip 200, causing a phenomenon of solder overflow. The solder paste overflowed to the outside edge of the chip 200 stops flowing due to loss of pressure caused by the weight of the chip 200, thereby generating accumulation.

Figure 8:
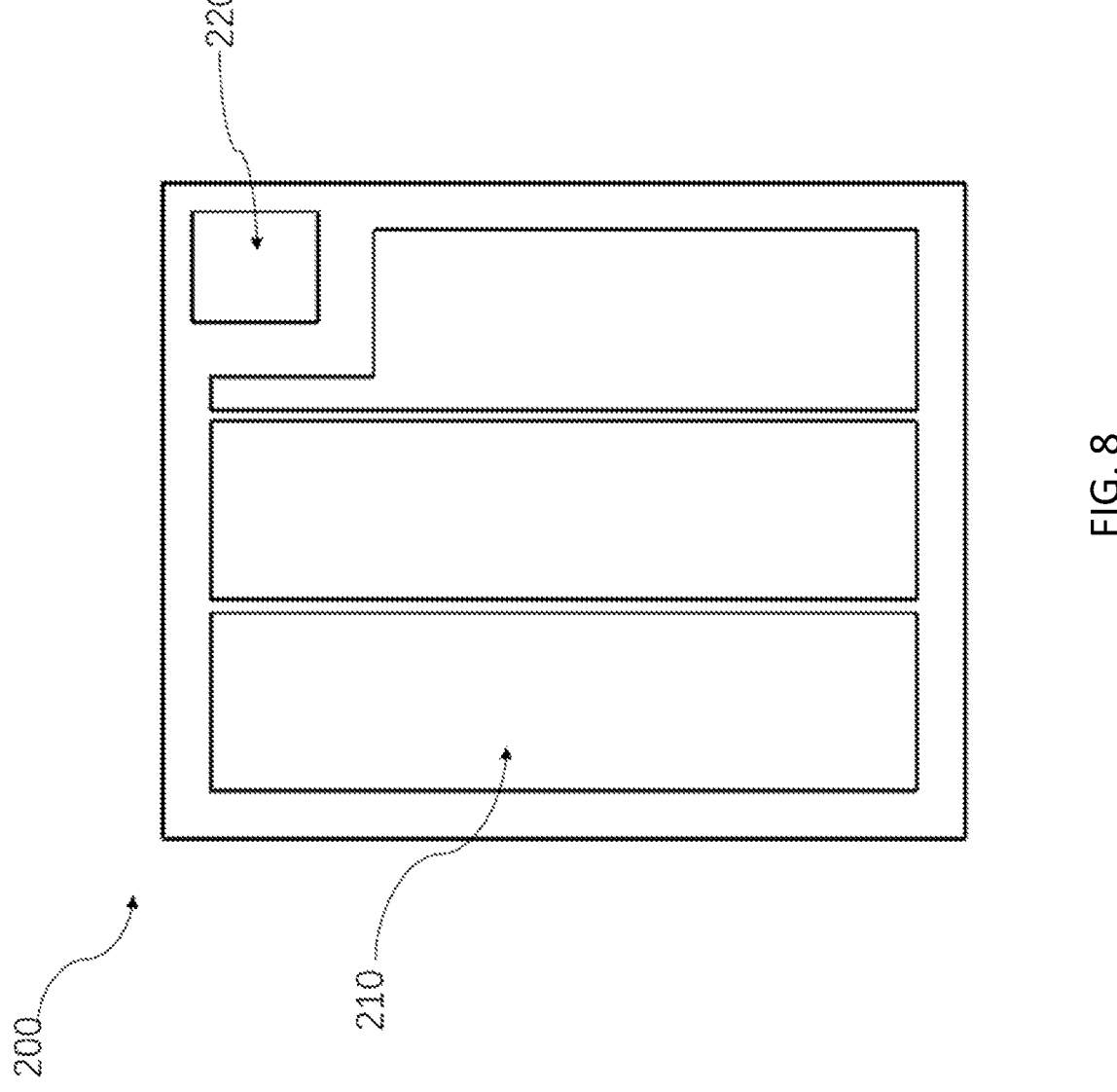
FIG. 8 is a schematic structural diagram of a chip.

Referring to FIG. 8, the chip 200 is a MOSFT (Metal-Oxide-Semiconductor Field-Effect Transistor) chip, and the source 210 and gate 220 of the chip 200 are arranged at intervals on a side of the chip 200 facing the bearing surface 111. The drain (not shown) of the chip 200 is mainly arranged on a side of the chip 200 that is away from the bearing surface 111, but a portion of the drain may extend to the sidewall of the chip 200, in order to prevent the drain from touching the source 210 of the chip 200. A passivation layer (not shown) may be provided in the chip 200, and the passivation layer will not be bonded with the solder paste. The function of the passivation layer is to prevent the solder paste from being connected to the source 210 and the drain. However, the thickness of the solder layer 120 is generally ≥10 μm (micrometer), and the distance that the solder paste overflows beyond the boundary of the soldering region 112 is generally about 250 μm, while the passivation layer is usually only 1 μm in thickness and 100 μm in width, and cannot block the overflow of the solder paste 121. Thus, when the overflowed solder paste 121 accumulates to a certain height in the thickness direction X, and if the bearing surface 111 as a whole is a plane, the overflowed solder paste 121 will contact the sidewall of the chip 200, causing the source 210 and/or gate 220 of the chip 200 to be in contact with and thus electronically connected to the drain, resulting in short or leakage.

In order to solve the problem of short or leakage caused by the overflowed solder paste, the existing solution is to reduce the amount of solder paste, and consequently, to reduce the opening of the stencil. In this way, the amount of solder paste that can be coated through the opening of the stencil can be reduced, so as to achieve the purpose of reducing the amount to avoid solder paste overflow. However, this may lead to problems, such as a smaller soldering area, more and larger voids, and so on, that are caused by having less solder paste, which affects the performance, reliability and service life of semiconductor devices. In addition, the size of the opening of the stencil is also limited by the manufacturing capacity of the stencil, and reducing the opening of the stencil requires use of smaller solder paste particles, which increases the production cost.

In the lead frame 100 provided by the embodiments of the present application, by providing a groove 113 on the bearing surface 111, where the groove 113 is located outside the soldering region 112 and surrounds at least part of the soldering region 112, a container for collecting the overflowed solder paste 121 is formed. That is, the overflowed solder paste 121 flows into the groove 113 and accumulates in the groove 113. In this way, the existence of the groove 113 forms a height drop in the thickness direction X, such that the overflowed solder paste 121 cannot accumulate to a height at which the overflowed solder paste 121 is in contact with the sidewall of the chip 200, and there is a gap in the thickness direction X between the overflowed solder paste 121 and the sidewall of the chip 200. Thus, the drain on the sidewall of the chip 200 cannot contact the source 210 and/or gate 220 through the solder paste, which avoids short circuit or leakage. Further, this only requires providing the groove 113 on the bearing surface 111 of the base 110 of the lead frame 100 to solve the problem of solder overflow, without the need to reduce the amount of solder paste used, without the need to reduce the solder paste particle size, and without the need to use other materials and fixtures, reduces production costs, and improves the stability and safety of using semiconductor devices.

In addition, referring to FIG. 1 to FIG. 6, the groove 113 may be arranged at a distance from the soldering region 112. Specifically, the distance between the groove 113 and the soldering region 112 is smaller than the distance that the solder overflows beyond the boundary of the soldering region 112, that is, the distance between the groove 113 and the soldering region 112 is less than 250 μm, such that the overflowed solder paste 121 can flow into the groove 113 without accumulating on the bearing surface 111. Although a certain amount solder paste may be accumulated on the bearing surface 111, the accumulation will not reach a height that the accumulated solder paste contacts the sidewall of the chip 200. In other implementation manners, referring to FIG. 7, the groove 113 may be in contact with the boundary of the soldering region 112, such that the overflowed solder paste 121 flows directly into the groove 113 without accumulating on the bearing surface 111.

Figure 6:
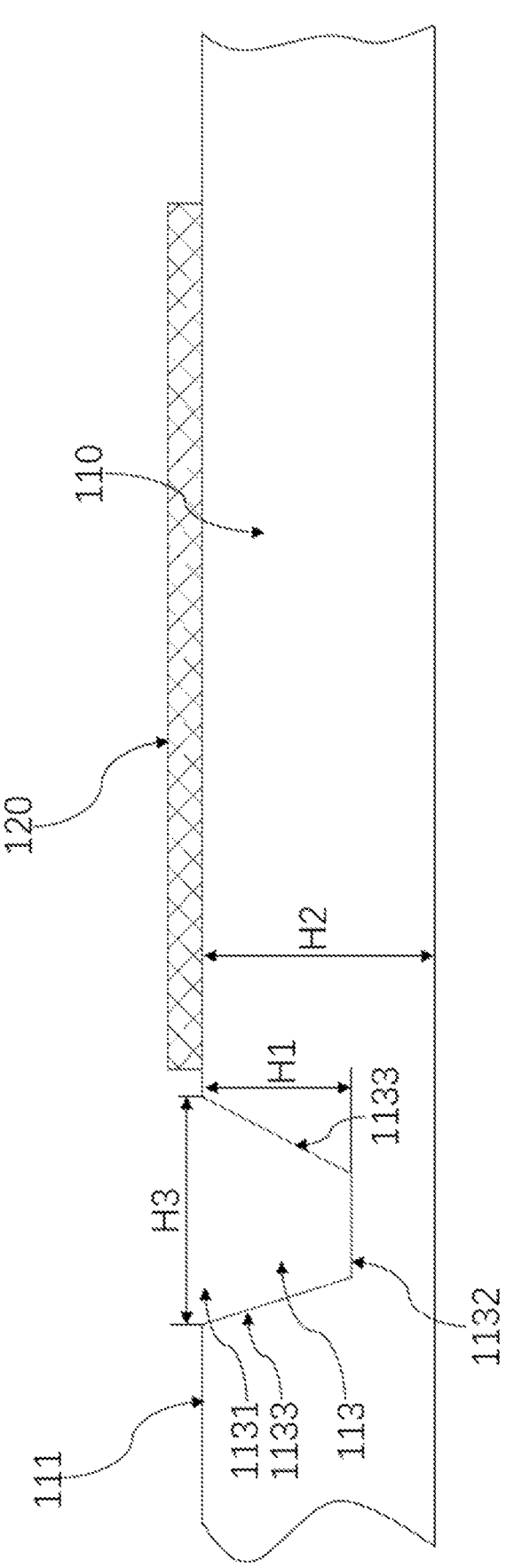
FIG. 6 is a schematic diagram showing a soldering region and a groove of a lead frame at a first relative position according to an embodiment of the present application.
Figure 7:
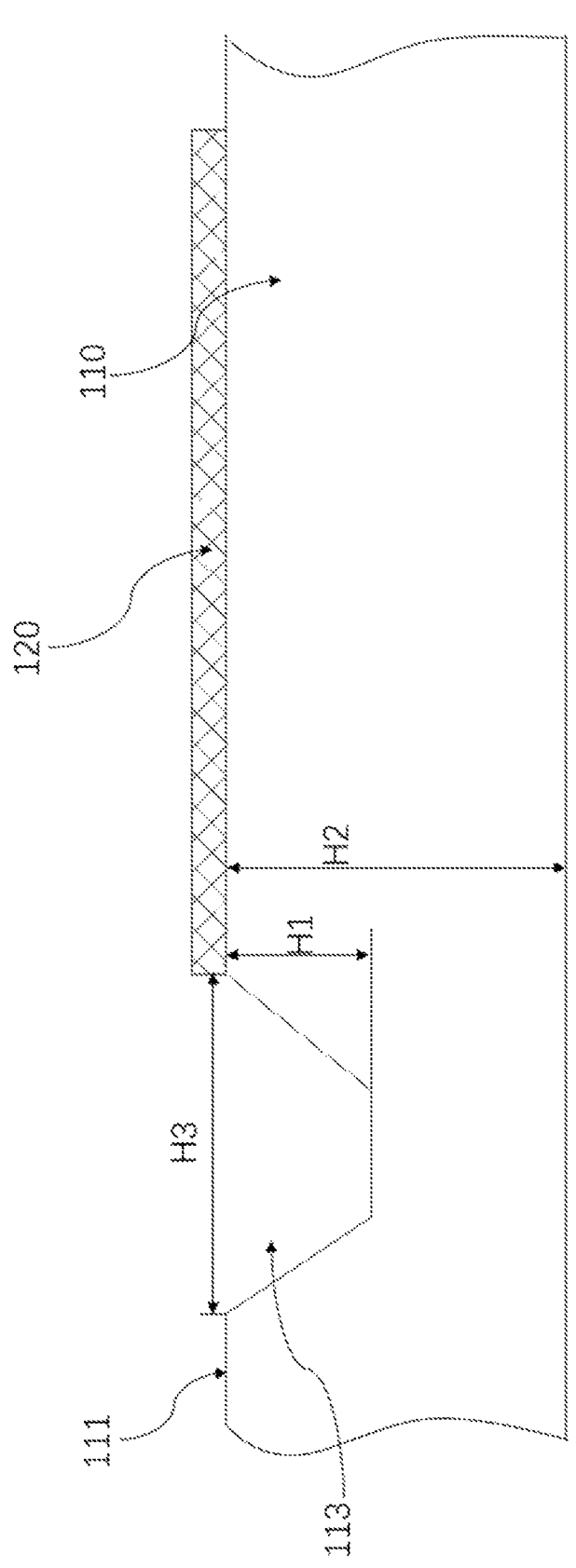
FIG. 7 is a schematic diagram showing a soldering region and a groove of a lead frame at a second relative position according to an embodiment of the present application.

In addition, referring to FIG. 6 and FIG. 7, the groove 113 includes an opening 1131 and an inner bottom wall 1132. The opening 1131 and the inner bottom wall 1132 are arranged oppositely in the thickness direction X, the distance between the opening 1131 and the inner bottom wall 1132 is H1, and the thickness of the base 110 is H2, satisfying: $H1=(\frac{1}{3} \sim \frac{1}{2}) \times H2$, preferably $H1=\frac{1}{2} \times H2$. That is, the depth of the groove 113 is $\frac{1}{3} \sim \frac{1}{2}$ of the thickness of the base 110, and preferably, the depth of the groove 113 is ½ of the thickness of the base 110, so that the overflowed solder paste 121 is accumulated in the groove 113, avoiding the overflowed solder paste 121 from accumulating to a height at which the overflowed solder paste 121 can touch the sidewall of the chip 200.

In addition, referring to FIG. 6 and FIG. 7, the width of the opening 1131 of the groove 113 is H3, which satisfies: H3=(½~1)×H2, and preferably, H3=H2. That is, the width of the opening 1131 is ½~1 of the thickness of the base 110, and the preferred width H3 of the opening 1131 is the same as the thickness H2 of the base 110, such that the groove 113 has enough space to contain the overflowed solder paste 121, avoiding the overflowed solder paste 121 to get contact with the drain on the sidewall of the chip 200.

Figure 3:
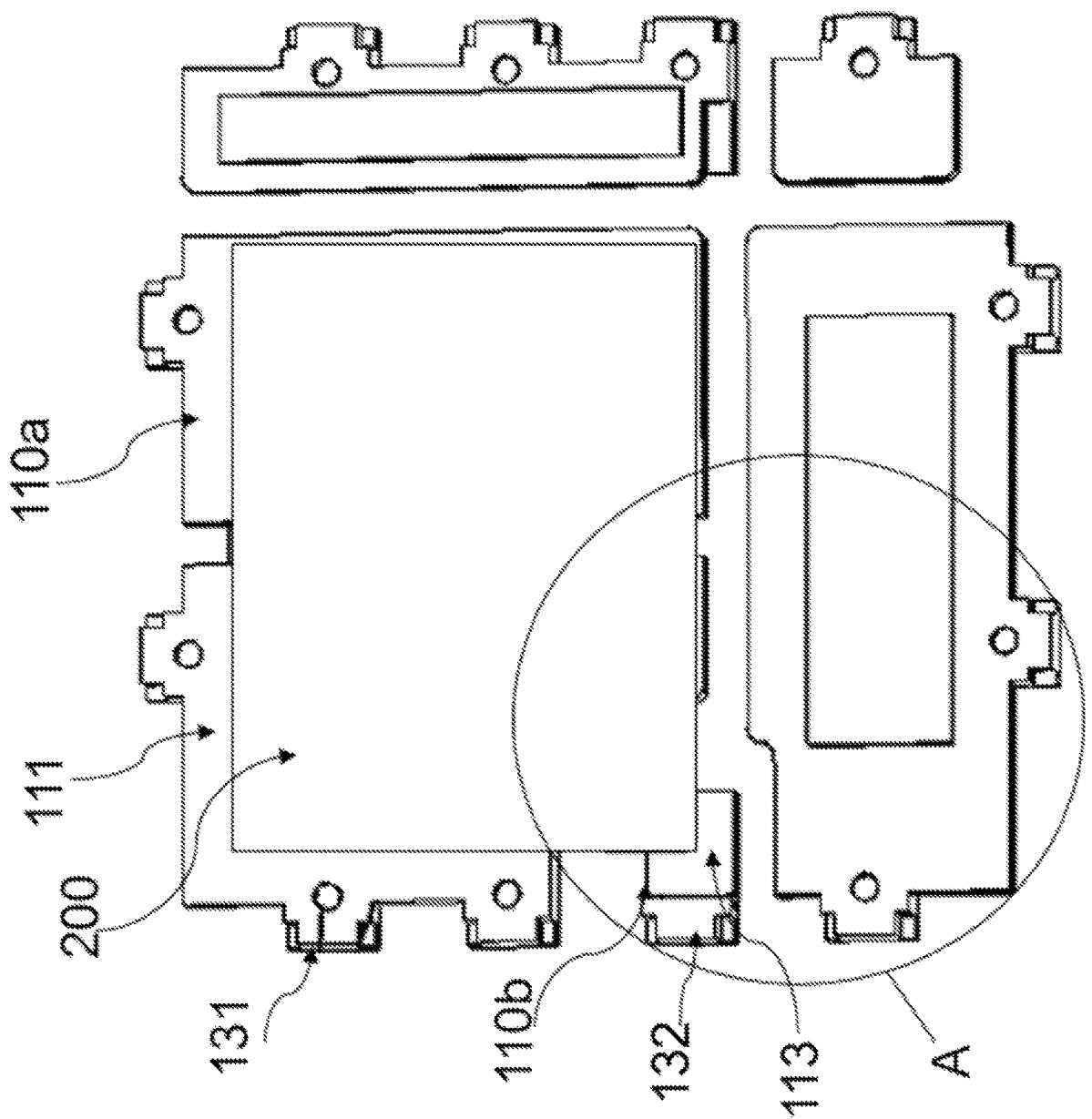
FIG. 3 is a schematic structural diagram of a combination of a lead frame and a chip according to an embodiment of the present application.

In addition, referring to FIG. 1 to FIG. 4, the base 110 includes a first base 110a and a second base 110b arranged at intervals, and the soldering region 112 includes a first soldering region 112a disposed on the first base 110a and a second soldering region 112b disposed on the second base 110b. The solder layer 120 is provided in the first soldering region 112a and the second soldering region 112b, respectively. The solder layer 120 in the first soldering region 112a is used to connect by soldering with the source 210 of the chip 200. The solder layer 120 in the second soldering region 112b is used to connect by soldering with the gate 220 of the chip 200. The groove 113 is provided on the second base 110b, the groove 113 is located outside the second soldering region 112b, and the shape of the groove 113 is an L-shape. The groove 113 is spaced apart from the second soldering region 112b and surrounds the second soldering region 112b. Referring to FIG. 3 and FIG. 4, when the chip 200 is flip-chip mounted on the bearing surface 111 of the base 110, the gate 220 of the chip 200 is in contact with the solder layer 120 in the second soldering region 112b, forming squeeze on the solder paste in the solder layer 120, and the solder paste is squeezed, overflows to the outside of the second soldering region 112b and flows into the groove 113, avoiding the overflowed solder paste 121 from contacting the drain on the sidewall of the chip 200 to cause the drain to be connected to the gate 220.

Figure 5:
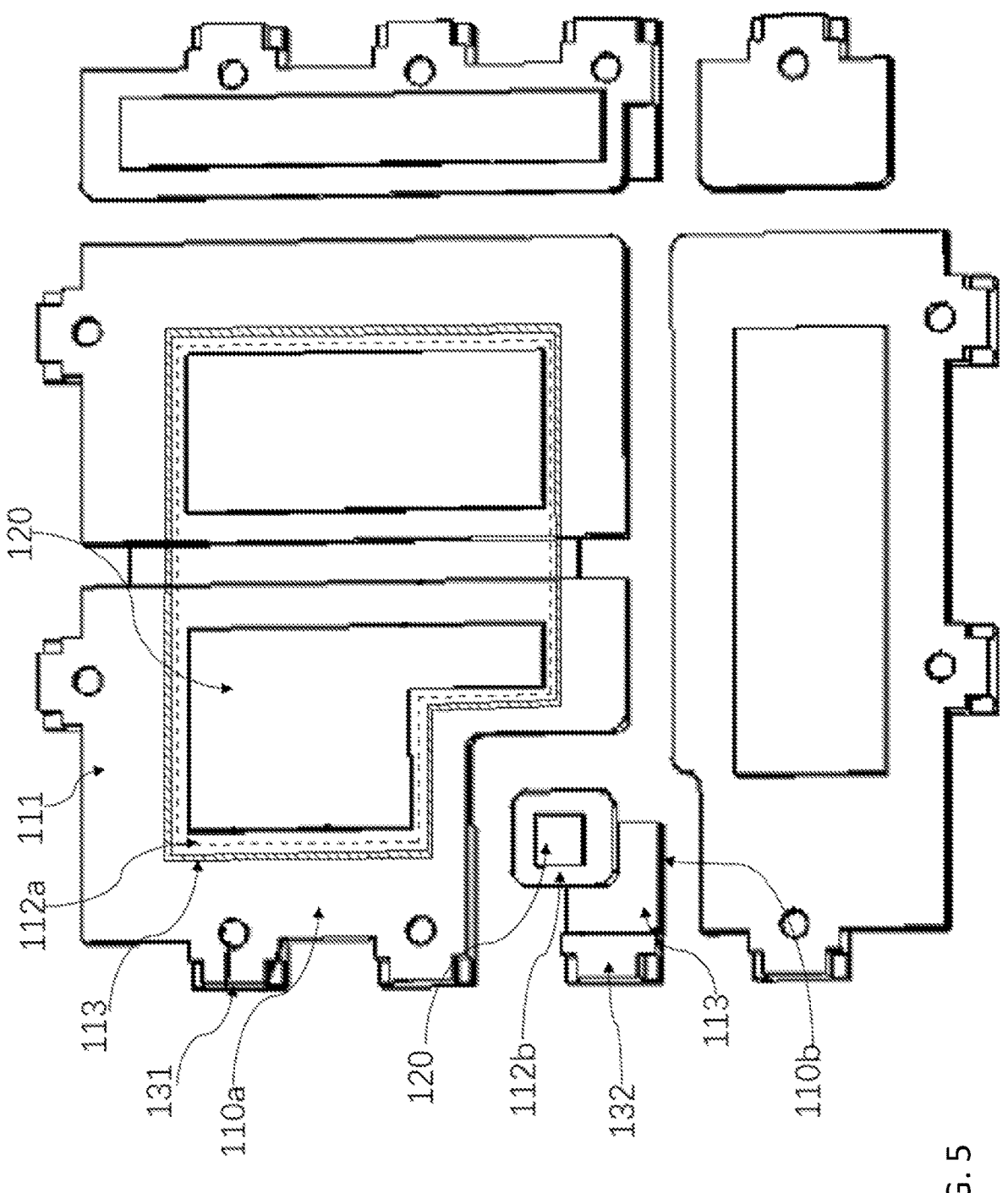
FIG. 5 is a schematic structural diagram of another lead frame according to an embodiment of the present application.

In addition, referring to FIG. 5, the groove 113 may also be provided on the first base 110a. The number of the groove 113 is one, the groove 113 has an annular shape, and the groove 113 is spaced apart from the first soldering region 112a and surrounds the first soldering region 112a. When the chip 200 is flip-chip mounted on the bearing surface 111 of the base 110, the source 210 of the chip 200 is in contact with the solder layer 120 in the first soldering region 112a, forming squeeze on the solder paste in the solder layer 120, and the solder is squeezed and overflows to the outside of the first soldering region 112a, and flows into the groove 113, avoiding the overflowed solder paste 121 from contacting the drain on the sidewall of the chip 200 to cause the drain to be connected to the source 210. In other implementing manners, there may be multiple grooves 113 provided on the first base 110a, which are arranged at intervals along the outer periphery of the first soldering region 112a. In some embodiments, two soldering sub-regions may be provided at intervals in the first soldering region 112a, and the groove 113 is provided outside the first soldering region 112a.

In addition, referring to FIG. 6 and FIG. 7, the groove 113 also includes two inner sidewalls 1133 arranged opposite to each other. The inner sidewall 1133 adjacent to the boundary of the soldering region 112 has a slope structure, which facilitates overflowed solder paste 121 to flow along the slope into the groove 113 to avoid accumulation.

In addition, referring to FIG. 1 to FIG. 5, the lead frame 100 also includes pins 130 arranged on the outer peripheral wall of the base 110 protruding from thereof. There may be a plurality of pins 130 arranged along the periphery of the based 110 at intervals. The plurality of pins 130 include a first pin 131 electronically connected to the source 210 of the chip 200, and a second pin 132 electronically connected to the gate 220 of the chip 200. In this embodiment, the number of the first pins 131 is four, and the first pins 131 are arranged at intervals along the periphery of the first base 110a. Clip copper sheet (not shown) is connected to the source 210 of the chip 200 through solder paste, and is connected to multiple first pins 131 respectively through solder paste. The number of the second pin 132 is one, and the second pin 132 is arranged on the sidewall of the second base 110b protruding from thereof. The second pin 132 is connected to the gate 220 of the chip 200 through a bonding wire (not shown) or through a copper clip, so as to lead out the gate 220 of the chip 200. The material of the bonding wire may be gold wire, copper wire or aluminum wire.

In addition, referring to FIG. 1 to FIG. 5, a through hole 133 is provided on each first pin 131, and the through hole 133 runs through the first pin 131 in the thickness direction X. Providing the through hole 133 is beneficial to increase the bonding strength between the first pin 131 and the plastic package, and prevents the first pin 131 from peeling off from the plastic package after subsequent product separation.

Embodiments of the present application also provide a packaging structure, and the packaging structure includes the aforementioned lead frame 100. Specifically, the packaging structure further includes a chip 200 and a plastic package (not shown).

Embodiments of the present application also provide a packaging method including the following steps.

S1. Provide the lead frame 100 as described above. The lead frame 100 is placed horizontally, and the groove 113 is formed on the bearing surface 111 by methods such as half-etching, indentation, stamping, and so on. A method may be selected based on factors such as the actual design requirement, material sizes, and so on. The lead frame 100 is processed and manufactured into product by a supplier of the lead frame 100.

S2. Coat solder paste in the soldering region 112 of the lead frame 100 to form the solder layer 120. The solder paste is tin paste, and the solder layer 120 is formed in the soldering region 112 by coating or printing the solder paste.

S3. Place the chip 200 in the soldering region 112 of the base 110 in the flip-chip manner, where the source 210 of the chip 200 is in contact with the solder layer 120 located in the first soldering region 112a, and the gate 220 of the chip 200 is in contact with the solder layer 120 located in the second soldering region 112b, and perform high temperature reflow soldering, to connect by soldering the chip 200 to the lead frame 100. When the chip 200 is in contact with the solder layer 120 and squeezes the liquid solder paste in the solder layer 120 to cause the solder paste to overflow, the overflowed solder 121 can flow into the groove 113 located outside the soldering region 112, preventing the overflowed solder 121 from accumulating on the bearing surface 111.

S4. Form a plastic packaging layer on the bearing surface 111 of the base 110 to package the chip 200, where the pins 130 of the lead frame 100 are located outside the plastic packaging layer.

The above provides detailed description about the lead frame, packaging structure and packaging method according to the embodiments of the present application. In the present disclosure, specific examples are used to illustrate the principle and implementation of the present application. The description of the above embodiments is only used to help understand the method and core idea of the present application; meanwhile, those skilled in the art may make modifications in specific implementation methods and application scope based on the concept of the present application. In view of above, the contents of the present disclosure should not be construed as limiting the present application.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A lead frame comprising:
a base comprising a first base and a second base arranged at intervals, the base comprising a bearing surface for bearing a chip, the bearing surface comprising a soldering region, and the soldering region comprising a first soldering region disposed on the first base and a second soldering region disposed on the second base, wherein the first soldering region is configured for soldering with a source of the chip, and the second soldering region is configured for soldering with a gate of the chip;
a solder layer arranged in the first soldering region and the second soldering region, and configured for fixing the chip on the bearing surface; and
a first groove in an annular shape and a second groove in an L-shape provided on the bearing surface in a thickness direction of the base, the first groove being located on the first base and outside and completely surrounding the first soldering region along the outer periphery of the first soldering region, and the second groove being located on the second base outside the second soldering region and surrounding partially the second soldering region along the outer periphery of the second soldering region.

2. The lead frame of claim 1, wherein the first groove is spaced apart from the first soldering region, or the second groove is space apart from the second soldering region.

3. The lead frame of claim 1, wherein the first groove is in contact with a boundary of the first soldering region, or the second groove is in contact with a boundary of the second soldering region.

4. The lead frame of claim 1, wherein a depth H1 of the first groove or the second groove is in a range from $\frac{1}{3} \times H2$ to $\frac{1}{2} \times H2$, and H2 is a thickness of the base.

5. The lead frame of claim 4, wherein a width H3 of the first groove or the second groove is in a range from $\frac{1}{2} \times H2$ to H2.

6. The lead frame of claim 1, further comprising:
a third groove disposed on the first base and at intervals with the first groove, the third groove being outside and surrounding the first soldering region along the outer periphery of the first soldering region.

7. The lead frame of claim 1, wherein the first groove further comprises two inner sidewalls oppositely arranged, and at least one inner sidewall of the two inner sidewalls that is adjacent to a boundary of the first soldering region is a slope.

8. The lead frame of claim 1, wherein a thickness of the solder layer is greater than or equal to 10 μm.

9. The lead frame of claim 1, further comprising:
a plurality of pins arranged on the outer peripheral wall of the base and protruding from the outer peripheral wall of the base, the plurality of pins being arranged at intervals along the periphery of the base, wherein the plurality of pins comprises a first pin configured to electronically connect to the source of the chip and a second pin configured to electronically connect to the gate of the chip.

10. A packaging structure comprising a lead frame, the lead frame comprising:
a base comprising a first base and a second base arranged at intervals, the base comprising a bearing surface for bearing a chip, the bearing surface comprising a soldering region, and the soldering region comprising a first soldering region disposed on the first base and a second soldering region disposed on the second base, wherein the first soldering region is configured for soldering with a source of the chip, and the second soldering region is configured for soldering with a gate of the chip;
a solder layer arranged in the first soldering region and the second soldering region, and configured for fixing the chip on the bearing surface; and
a first groove in an annular shape and a second groove in an L-shape provided on the bearing surface in a thickness direction of the base, the first groove being located on the first base and outside and completely surrounding the first soldering region along the outer periphery of the first soldering region, and the second groove being located on the second base outside the second soldering region and surrounding partially the second soldering region along the outer periphery of the second soldering region.

11. The packaging structure of claim 10, wherein the first groove is spaced apart from the first soldering region, or the second groove is space apart from the second soldering region.

12. The packaging structure of claim 10, wherein the first groove is in contact with a boundary of the first soldering region, or the second groove is in contact with a boundary of the second soldering region.

13. The packaging structure of claim 10, wherein a depth H1 of the first groove or the second groove is in a range from $\frac{1}{3} \times H2$ to $\frac{1}{2} \times H2$, and H2 is a thickness of the base.

14. The packaging structure of claim 10, wherein a width H3 of an opening of the first groove or the second groove is in a range from $\frac{1}{2} \times H2$ to H2 and H2 is a thickness of the base.

15. The packaging structure of claim 10, wherein the lead frame further comprises a third groove disposed on the first base and at intervals with the first groove, the third groove being outside and surrounding the first soldering region along the outer periphery of the first soldering region.

16. The packaging structure of claim 10, wherein a thickness of the solder layer is greater than or equal to 10 μm.

17. The packaging structure of claim 10, wherein the lead frame further comprises:

a plurality of pins arranged on the outer peripheral wall of the base and protruding from the outer peripheral wall of the base, the plurality of pins being arranged at intervals along the periphery of the base, wherein the plurality of pins comprises a first pin configured to electronically connect to the source of the chip and a second pin configured to electronically connect to the gate of the chip.

18. A packaging method comprising:

providing a lead frame, the lead frame comprising:

a base comprising a first base and a second base arranged at intervals, the base comprising a bearing surface for bearing a chip, the bearing surface comprising a soldering region, and the soldering region comprising a first soldering region disposed on the first base and a second soldering region disposed on the second base, wherein the first soldering region is configured for soldering with a source of the chip, and the second soldering region is configured for soldering with a gate of the chip; and a first groove in an annular shape and a second groove in an L-shape provided on the bearing surface in a thickness direction of the base, the first groove being located on the first base and outside and completely surrounding the first soldering region along the outer periphery of the first soldering region, and the second groove being located on the second base outside the second soldering region and surrounding partially the second soldering region along the outer periphery of the second soldering region;

forming a solder layer in the first soldering region and the second soldering region by coating solder paste in the first soldering region and the second soldering region;

placing flip-chip the chip on the bearing surface of the base, with the source and the gate of the chip being in contact with the solder layer, and performing high temperature reflow soldering to connect the chip and the lead frame by soldering; and forming a plastic packaging layer on the bearing surface of the base to package the chip, wherein pins of the lead frame are located outside the plastic packaging layer.

19. The packaging method of claim 18, wherein the first groove is spaced apart from the first soldering region, or is in contact with a boundary of the first soldering region; and the second groove is spaced apart from the second soldering region, or is in contact with a boundary of the second soldering region.

20. The packaging method of claim 18, wherein a depth H1 of the first groove or the second groove is in a range from $\frac{1}{3} \times H2$ to $\frac{1}{2} \times H2$, and H2 is a thickness of the base.

* * * * *